(12) United States Patent
Jones et al.

(10) Patent No.: US 7,939,763 B2
(45) Date of Patent: May 10, 2011

(54) HORIZONTAL CABLE MANAGER

(75) Inventors: Trent Jones, White Bear Lake, MN (US); Jeremy Fink, Anoka, MN (US); Marcus Adrian Koukkari, Duluth, MN (US); Brian Lynn Mordick, Shoreview, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 239 days.

(21) Appl. No.: 12/206,572

(22) Filed: Sep. 8, 2008

(65) Prior Publication Data

US 2009/0090533 A1    Apr. 9, 2009

Related U.S. Application Data

(60) Provisional application No. 60/967,701, filed on Sep. 6, 2007.

(51) Int. Cl.
*H02G 3/04* (2006.01)
(52) U.S. Cl. .............. 174/101; 174/68.1; 174/72 A; 439/719; 211/26; 361/826; 385/135
(58) Field of Classification Search .............. 174/101, 174/68.3, 72 A, 95, 68.1; 439/719; 211/26, 211/85; 361/826, 829; 248/49, 68.1; 385/135
See application file for complete search history.

(56) References Cited

U.S. PATENT DOCUMENTS

| | | |
|---|---|---|
| 555,766 A | 3/1896 | Pletcher |
| 1,381,335 A | 6/1921 | Reed |
| 2,140,376 A | 12/1938 | Anderson |
| 2,531,110 A | 11/1950 | Cisler |
| 2,817,870 A | 12/1957 | Howell |
| 2,848,826 A | 8/1958 | Heble |
| 2,896,009 A * | 7/1959 | Caveney .............. 174/72 A |
| 2,921,607 A | 1/1960 | Caveney |
| 3,008,177 A | 11/1961 | Wooten, Jr. |
| 3,024,301 A | 3/1962 | Walch |
| 3,346,688 A | 10/1967 | Fields |
| 3,485,937 A | 12/1969 | Caveney |

(Continued)

FOREIGN PATENT DOCUMENTS

EP    0555187    8/1993

(Continued)

OTHER PUBLICATIONS

U.S. Appl. No. 10/992,640, McGrath et al.

(Continued)

*Primary Examiner* — Dhiru R Patel
(74) *Attorney, Agent, or Firm* — Quarles & Brady LLP (57) ABSTRACT

Embodiments of the invention provide a horizontal cable manager. A horizontal base can include a first molded section and an identical second molded section adapted to be coupled together. The horizontal cable manager can include a plurality of fingers extending from each one of the first molded section and the second molded section. The fingers can include a shaft and an arrow-shaped end. The arrow-shaped end can include a first triangular member and a second triangular member each coupled to opposite sides of the shaft at a first distance away from a distal end of the shaft. The horizontal cable manager can include hinge supports with a cover removably coupled to the hinge supports. The horizontal base can include an attachment hole, a first extension, and a second wing extension for temporary attachment to an electronic equipment rack.

24 Claims, 14 Drawing Sheets

U.S. PATENT DOCUMENTS

| | | | |
|---|---|---|---|
| 3,488,795 A | 1/1970 | Marguelisch | |
| 3,705,949 A | 12/1972 | Weiss | |
| 3,890,459 A | 6/1975 | Caveney | |
| 3,966,074 A | 6/1976 | Hotchkiss et al. | |
| 3,968,322 A | 7/1976 | Taylor | |
| 4,046,957 A | 9/1977 | Taylor et al. | |
| 4,099,819 A | 7/1978 | Keglewitsch | |
| 4,136,257 A | 1/1979 | Taylor | |
| 4,484,020 A | 11/1984 | Loof et al. | |
| 4,613,174 A | 9/1986 | Berg et al. | |
| 4,641,225 A | 2/1987 | Reichle | |
| 4,649,658 A | 3/1987 | Sarton et al. | |
| 4,719,321 A | 1/1988 | Kozel et al. | |
| 4,752,249 A | 6/1988 | Unger et al. | |
| 4,902,852 A | 2/1990 | Wuertz | |
| 5,023,404 A | 6/1991 | Hudson et al. | |
| 5,089,667 A | 2/1992 | Goussin et al. | |
| 5,115,377 A | 5/1992 | Dransman | |
| 5,187,836 A | 2/1993 | Kim et al. | |
| 5,241,136 A | 8/1993 | Michaelis et al. | |
| 5,326,934 A | 7/1994 | LeMaster et al. | |
| 5,402,515 A | 3/1995 | Vidacovich et al. | |
| D360,189 S | 7/1995 | Orlando | |
| 5,542,549 A | 8/1996 | Siemon et al. | |
| 5,586,012 A | 12/1996 | Lerman | |
| 5,597,980 A | 1/1997 | Weber | |
| 5,715,348 A | 2/1998 | Falkenberg et al. | |
| 5,788,087 A | 8/1998 | Orlando | |
| 5,836,551 A | 11/1998 | Orlando | |
| 5,918,837 A | 7/1999 | Vicain | |
| 5,921,402 A | 7/1999 | Magenheimer | |
| 5,964,611 A | 10/1999 | Jacob et al. | |
| 6,005,188 A | 12/1999 | Teichler et al. | |
| 6,011,221 A * | 1/2000 | Lecinski et al. | 174/72 A |
| 6,102,214 A | 8/2000 | Mendoza | |
| 6,107,575 A | 8/2000 | Miranda | |
| 6,107,576 A | 8/2000 | Morton et al. | |
| 6,118,075 A | 9/2000 | Baker et al. | |
| 6,140,584 A | 10/2000 | Baldissara | |
| 6,170,784 B1 | 1/2001 | MacDonald et al. | |
| 6,215,064 B1 | 4/2001 | Noble et al. | |
| 6,223,909 B1 | 5/2001 | Mendoza | |
| 6,245,998 B1 | 6/2001 | Curry et al. | |
| 6,259,851 B1 | 7/2001 | Daoud | |
| 6,347,714 B1 | 2/2002 | Fournier et al. | |
| 6,365,834 B1 | 4/2002 | Larsen et al. | |
| 6,403,885 B1 | 6/2002 | Baker, III et al. | |
| 6,437,243 B1 | 8/2002 | VanderVelde et al. | |
| 6,438,309 B1 | 8/2002 | Franz | |
| 6,467,633 B1 | 10/2002 | Mendoza | |
| 6,468,112 B1 | 10/2002 | Follingstad et al. | |
| 6,489,565 B1 | 12/2002 | Krietzman et al. | |
| 6,513,289 B1 | 2/2003 | Decore et al. | |
| 6,541,705 B1 | 4/2003 | McGrath | |
| 6,600,107 B1 | 7/2003 | Wright et al. | |
| 6,605,782 B1 | 8/2003 | Krietzman et al. | |
| 6,614,978 B1 | 9/2003 | Caveney | |
| 6,766,093 B2 | 7/2004 | McGrath et al. | |
| 6,796,437 B2 | 9/2004 | Krampotich et al. | |
| 6,884,942 B2 | 4/2005 | McGrath et al. | |
| 7,000,784 B2 | 2/2006 | Canty et al. | |
| 7,026,553 B2 | 4/2006 | Levesque et al. | |
| 7,119,282 B2 | 10/2006 | Krietzman et al. | |
| 7,178,679 B2 | 2/2007 | Canty et al. | |
| 2005/0247650 A1 | 11/2005 | Vogel et al. | |
| 2006/0080646 A1 | 4/2006 | Aman | |
| 2006/0091086 A1 | 5/2006 | Canty et al. | |
| 2006/0213853 A1 | 9/2006 | Schluter et al. | |

FOREIGN PATENT DOCUMENTS

| | | |
|---|---|---|
| WO | WO 99/52190 | 10/1999 |
| WO | WO 02/075887 | 9/2002 |

OTHER PUBLICATIONS

Panduit Communication Products, Panduit Corporation, pp. D33, D34, D35, date unknown.

Panduit Corporation Installation Instructions Sheet, 1999.

B-Line Telecom Equipment Supports, B-Line Systems, Inc., Highland Park, Illinois, date unknown.

Hubbell Premise Wiring 2U Horizontal Cable MGMT Panel Assembly Drawing, date unknown.

Siemon Co. Terminal Block Cover Photographs, date unknown.

* cited by examiner

HORIZONTAL CABLE MANAGER

RELATED APPLICATIONS

This application claims priority to U.S. Provision Application No. 60/967,701, filed Sep. 6, 2007, the entire contents of which are incorporated herein by reference.

BACKGROUND

Equipment racks are used for easy organization and storage of computers, servers, and other electronic equipment. While the design of these racks has been modified to improve storage and containment, cable managers to sufficiently organize all of the cables, wires, etc. linked to the equipment held on these racks are still in need of improvement.

Typical horizontal cable managers include finger-like projections extending from a base that can be connected to an equipment rack. Some include one finger protruding perpendicular from the base and a second "L-shaped" finger also protruding from the base below or above the first Finger, but having a distal end that curves at an approximate right angle such that the two fingers together make a D-shaped cable ring for cables to be held. A second type of horizontal cable manager includes a multitude of fingers protruding from a base along the horizontal plane such that cable rings are formed by adjacent fingers. Current horizontal cable managers that are popular in the electronics world today have a multitude of thin fingers extending from a base. Each finger has projections at the distal end, often forming a "T-shape." Additionally, conventional horizontal cable managers require a user to fasten the base to the vertical supports of the rack with one hand while holding up the cable manager with the other hand.

SUMMARY

Some embodiments of the invention provide a horizontal cable manager including a horizontal base and a plurality of fingers extending from the horizontal base. Each one of the plurality of fingers can include a shaft and an arrow-shaped end. The arrow-shaped end can include a first triangular member and a second triangular member each coupled to opposite sides of the shaft at a first distance away from a distal end of the shaft. The horizontal cable manager can include at least two hinge supports with a cover removably coupled to the at least two hinge supports. The first hinge support can extend from a first end of the base past the plurality of fingers and the second hinge support can extend from a second end of the base past the plurality of fingers.

Some embodiments of the invention provide a horizontal cable manager including a base with an attachment hole configured to be substantially permanently attached to the vertical supports with a fastener positioned through the attachment hole and one of the rack holes. The base can also include a first extension and a second wing extension positioned adjacent to the attachment hole. The first extension can be configured to be temporarily positioned in another one of the rack holes while the second wing extension can wrap around the vertical support to temporarily snap the base to the vertical support until the base can be substantially permanently attached to the vertical support.

Some embodiments of the invention provide a horizontal cable manager including a first molded section and a second molded section, each one of the first molded section and the second molded section being identical and being adapted to be coupled together. The horizontal cable manager can also include a plurality of fingers extending from each one of the first molded section and the second molded section.

Other aspects of the invention will become apparent by consideration of attached drawings.

DETAILED DESCRIPTION OF THE DRAWINGS

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Figure 1A:
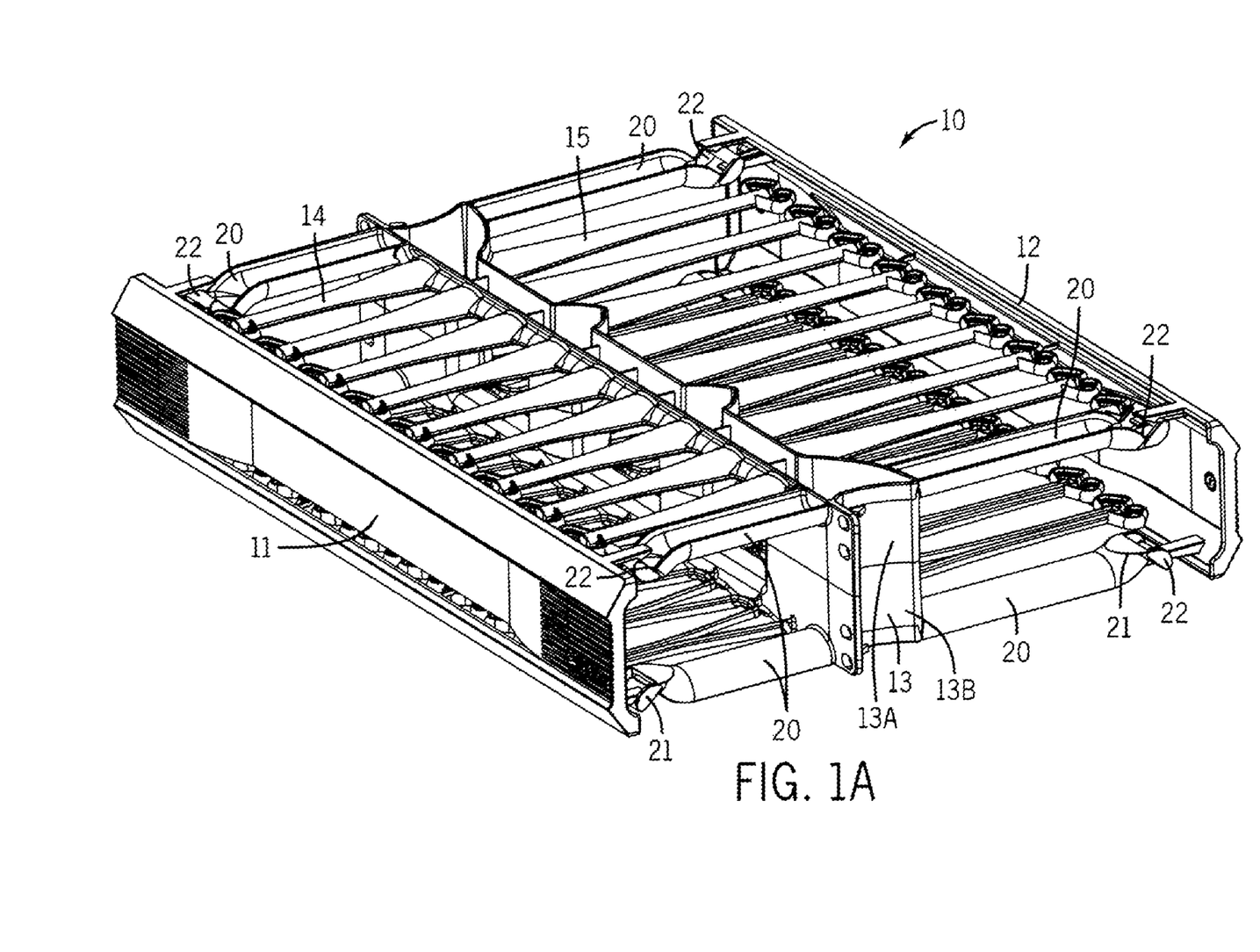
FIG. 1A is a front perspective view of a horizontal cable manager according to one embodiment of the invention.
Figure 1B:
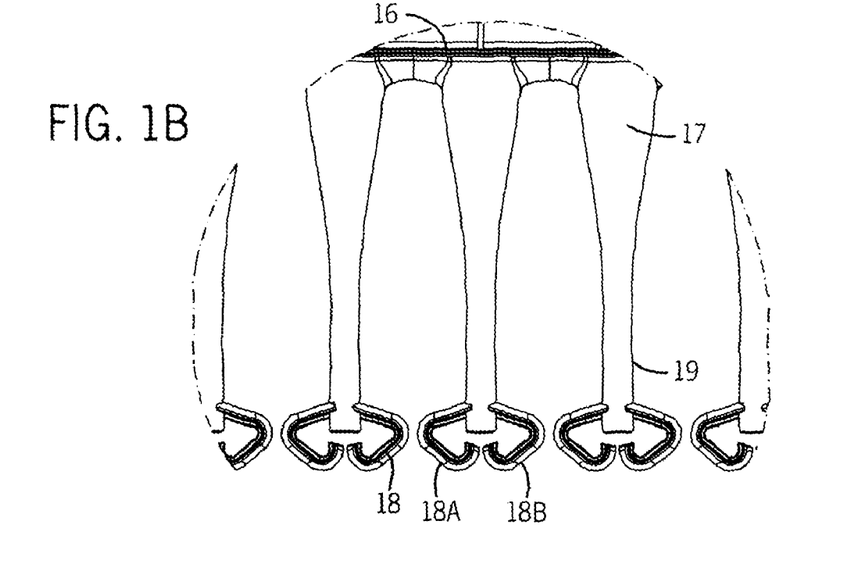
FIG. 1B is a top view of fingers of the horizontal cable manager of FIG. 1A.

FIG. 1A illustrates a horizontal cable manager 10 according to one embodiment of the invention. The horizontal cable manager 10 can include a front cover 11 and a rear cover 12. The front cover 11 and the rear cover 12 are each shown in closed positions in FIG. 1A. The horizontal cable manager 10 can include a base 13 and front fingers 14. Some embodiments can also include rear fingers 15 (e.g., a "double-sided manager"). In some embodiments, the rear fingers 15 can be longer than the front fingers 14. As shown in FIG. 1B, each one of the front fingers 14 and the rear fingers 15 can include a base 16, a shaft 17, and an arrow-shaped end 18. For each finger 14 or 15, the arrow-shaped end 18 can be coupled to the shaft 17 toward its distal end. The arrow-shaped end 18 can extend transversely past the distal end of the shaft 17 before curving back toward the shaft 17 in order to form two outward-facing triangular shapes. A cable ring 19 can be formed between adjacent fingers 14, 15 to allow cables or wires to be conveniently gathered. The arrow-shaped end 18 and/or the shaft 17 can be constructed of a material possessing sufficient flexibility to allow the insertion of wires, yet rigid enough to retain wires after insertion into the cable ring 19.

Figures 2A, 2B:
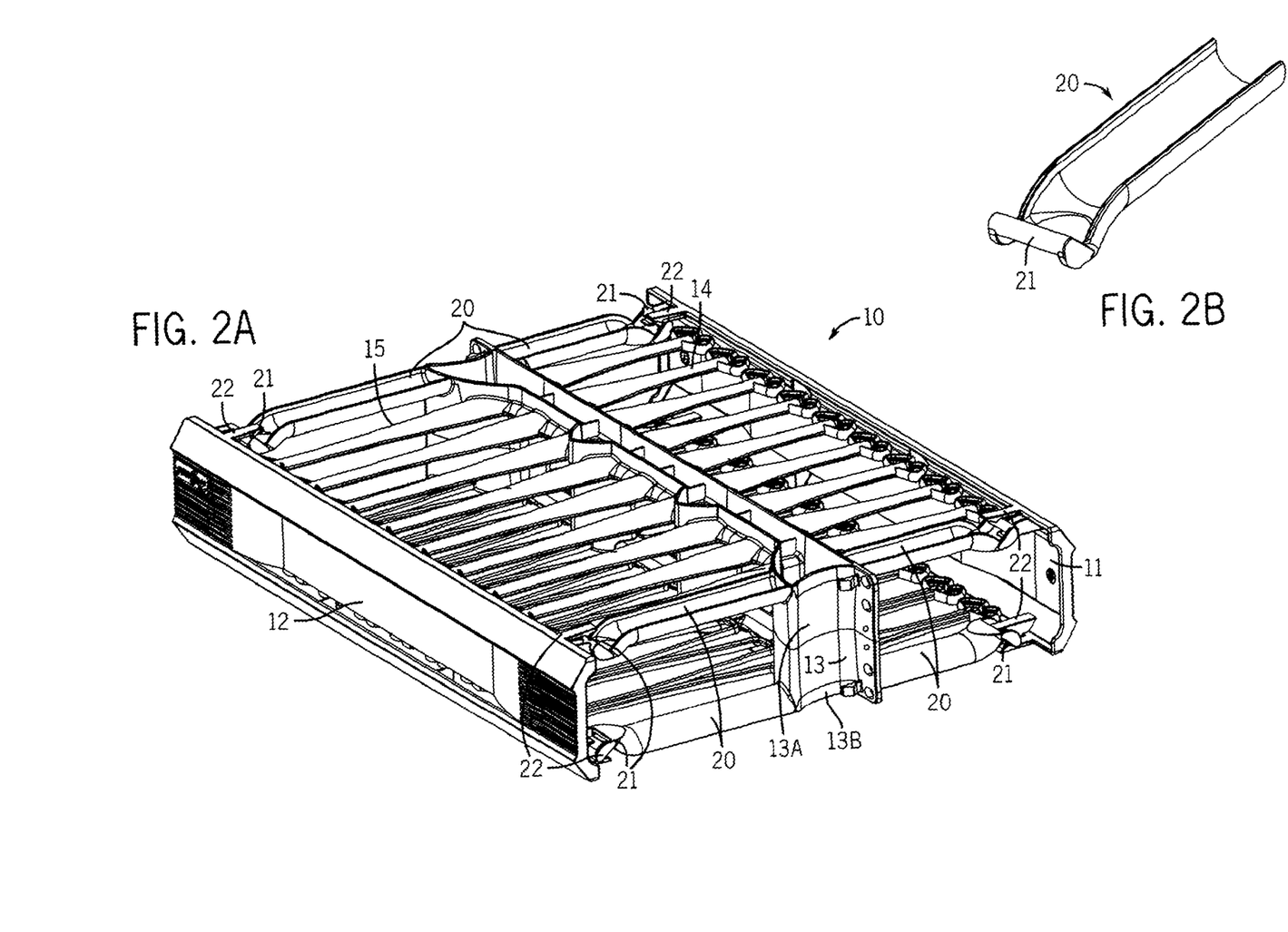
FIG. 2A is a rear perspective view of the horizontal cable manager of FIG. 1A.
FIG. 2B is an exploded view a hinge support of the horizontal cable manager of FIG. 2A.

As shown in FIGS. 1A, 2A, and 2B, the horizontal cable manager 10 can include hinge supports 20 with a thicker, stronger shaft than the fingers 14, 15. The hinge supports 20 can also include hooked ends 21 at the distal ends of the shafts for attachment to one of the covers 11, 12. The front and/or rear covers 11, 12 can be attached to the hinge supports 20 of the horizontal cable manager 10 to substantially cover the arrow-shaped ends 18. The front and rear covers 11, 12 can attach only to the hinge supports 20 to allow for rotation upward or downward about the hooked ends 21. In some embodiments, the front and rear covers 11, 12 can be attached to two hinge supports 20 on the top of the horizontal cable manager 10 and two hinge supports 20 on the bottom of the horizontal cable manager 10, so that the covers 11, 12 can be rotated upward or downward or completely removed.

Figure 3:
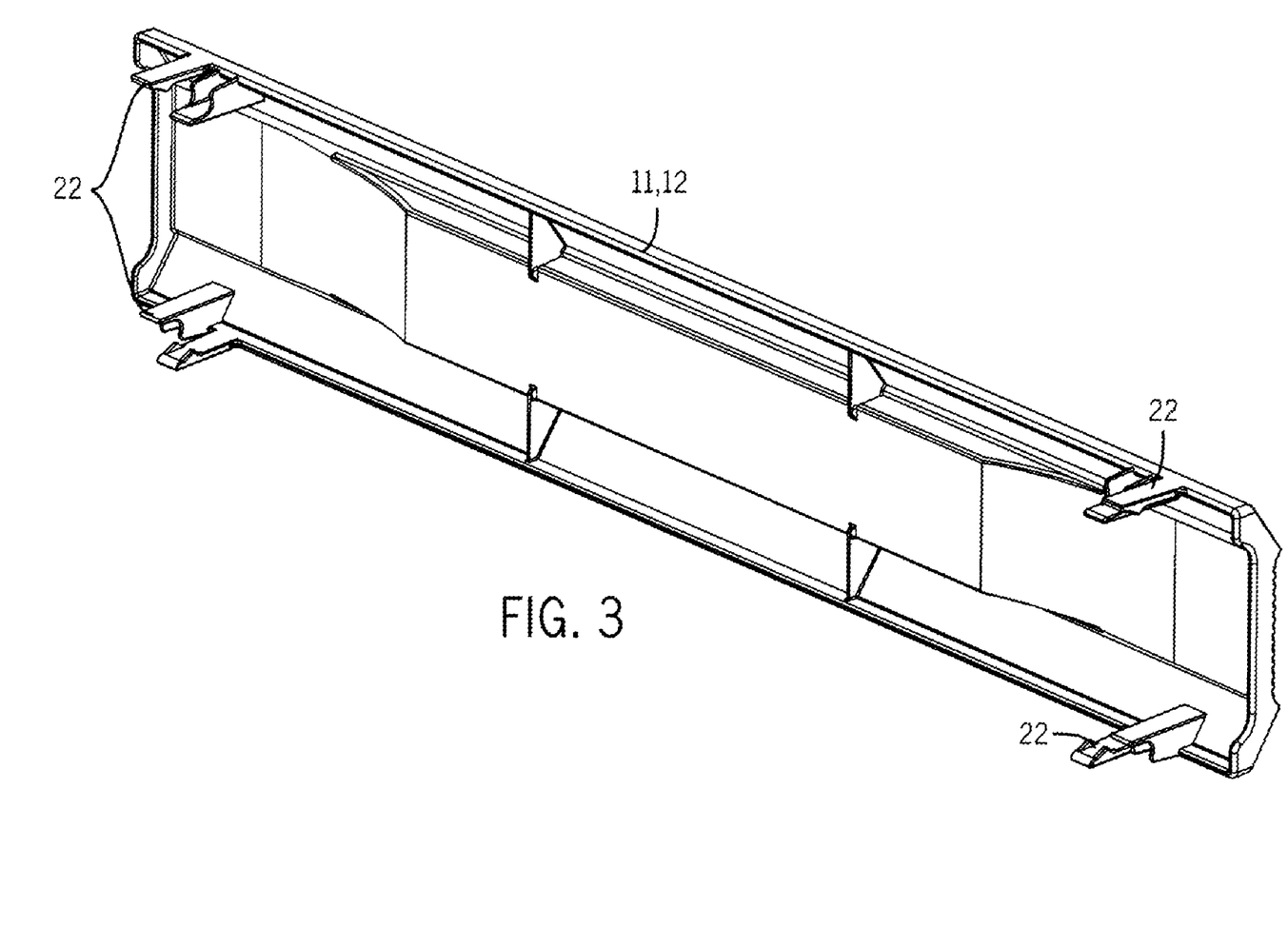
FIG. 3 is a rear perspective view of a cover of the horizontal cable manager of FIG. 1A.

FIG. 3 illustrates a front or rear cover 11 or 12 with attachment points 22. These attachment points 22 can snap around the hooked ends 21 of the hinge supports 20. The top and bottom attachment points 22 can allow for sufficient retention but allow rotation when the cover 11, 12 is only attached to either the top or bottom hinge supports 20.

Figure 4:
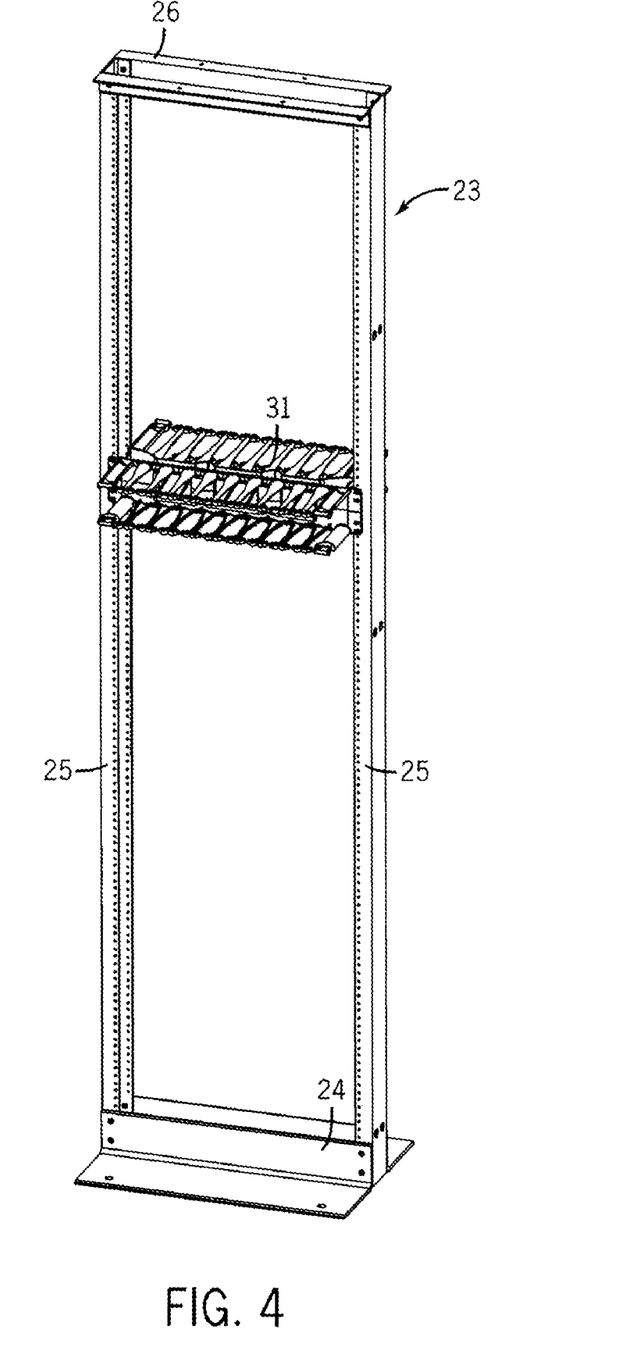
FIG. 4 is a front perspective view of a horizontal cable manager according to another embodiment of the invention attached to an electronic equipment rack.

FIG. 4 illustrates a horizontal cable manager 31 according another embodiment of the invention attached to an electronic equipment rack 23. The electronic equipment rack 23 can include a base 24, two vertical supports 25 extending upward from opposite sides of the base 24, and a top support 26 connecting the upper ends of the vertical supports 25. One or more horizontal cable managers 31 can be connected to the vertical supports 25 of the electronic equipment rack 23 at a desired height on the electronic equipment rack 23 corresponding to the height of respective electronic components. Cables or wires can be drawn vertically up or down the vertical supports 25 of the electronic equipment rack 23 to the approximate height of the desired electronic component and its respective cable manager 31. The cables or wires can then be drawn laterally across the base 13 of the horizontal cable manager 31 to the desired input on the component and finally pulled across the arrow-shaped ends 18 into the cable ring 19.

Long-term connection between the horizontal cable manager 10 and the electronic equipment rack 23 can be made by aligning holes 29 on either side of the horizontal cable manager 10 to respective standard holes on the vertical supports 25 of the electronic equipment rack 23. Screws or other fasteners can then be used to attach the horizontal cable manager 10 to the electronic equipment rack 23.

Figure 1C:
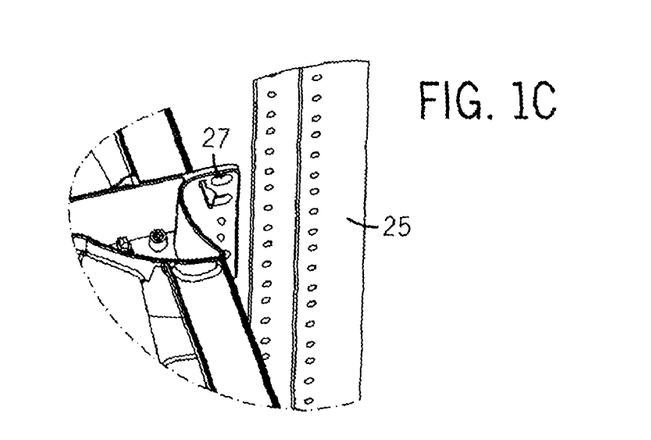
FIG. 1C is a partial perspective view of a snap-to-rack feature of the horizontal cable manager of FIG. 1A being positioned along a vertical support of an electronic equipment rack.
Figure 1D:
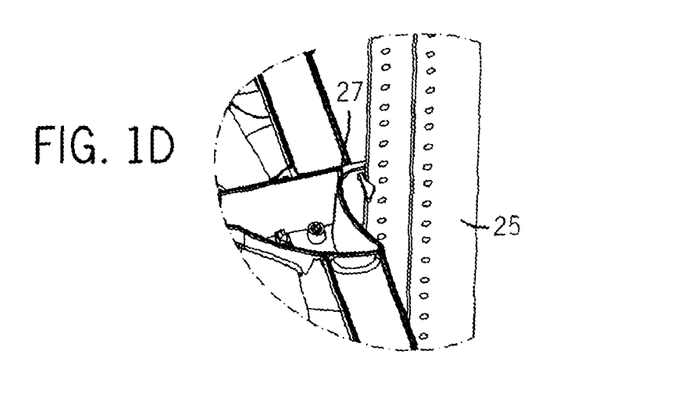
FIG. 1D is a partial perspective view of the snap-to-rack feature of FIG. 1C after being attached to the vertical support of the electronic equipment rack.

FIGS. 1C and 1D illustrate a snap-to-rack feature 27 according to one embodiment of the invention. This feature enables a temporary connection to be made between the horizontal cable manager 10 and the vertical supports 25 of the electronic equipment rack 23.

Figure 5A:
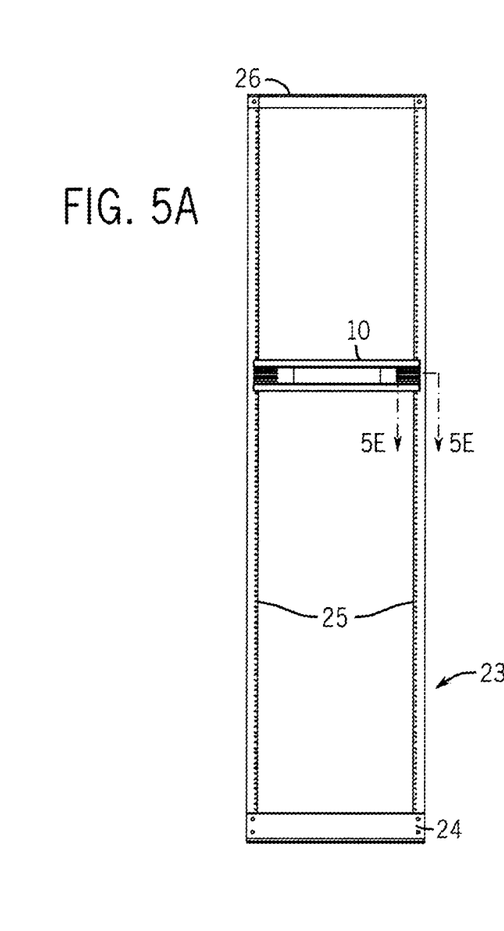
FIG. 5A is a front view of a the horizontal cable manager of FIG. 1A attached to an electronic equipment rack.
Figure 5B:
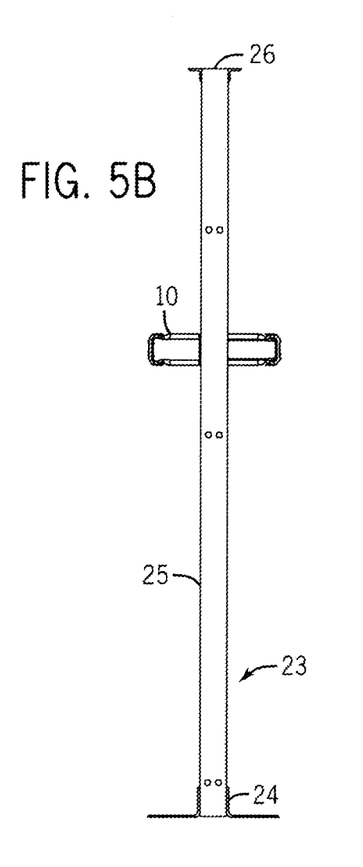
FIG. 5B is a side view of the horizontal cable manager of FIG. 1A attached to an electronic equipment rack.
Figure 5C:
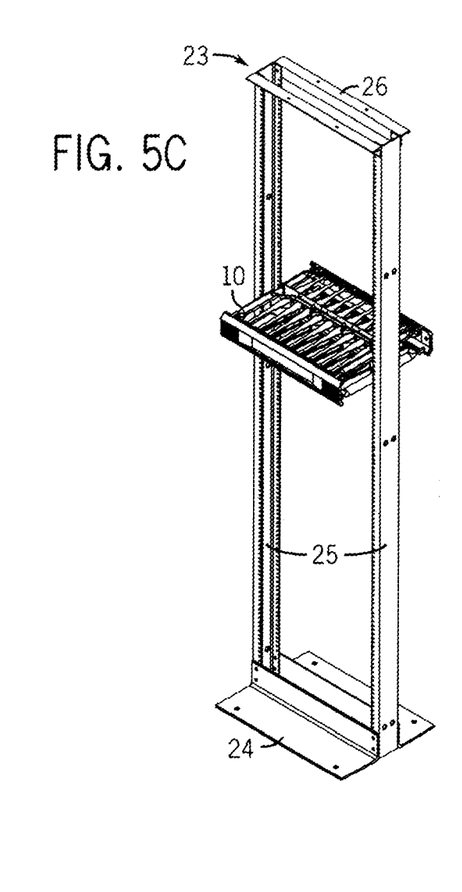
FIG. 5C is a front perspective view of the horizontal cable manager of FIG. 1A attached to an electronic equipment rack.
Figures 5D, 5E:
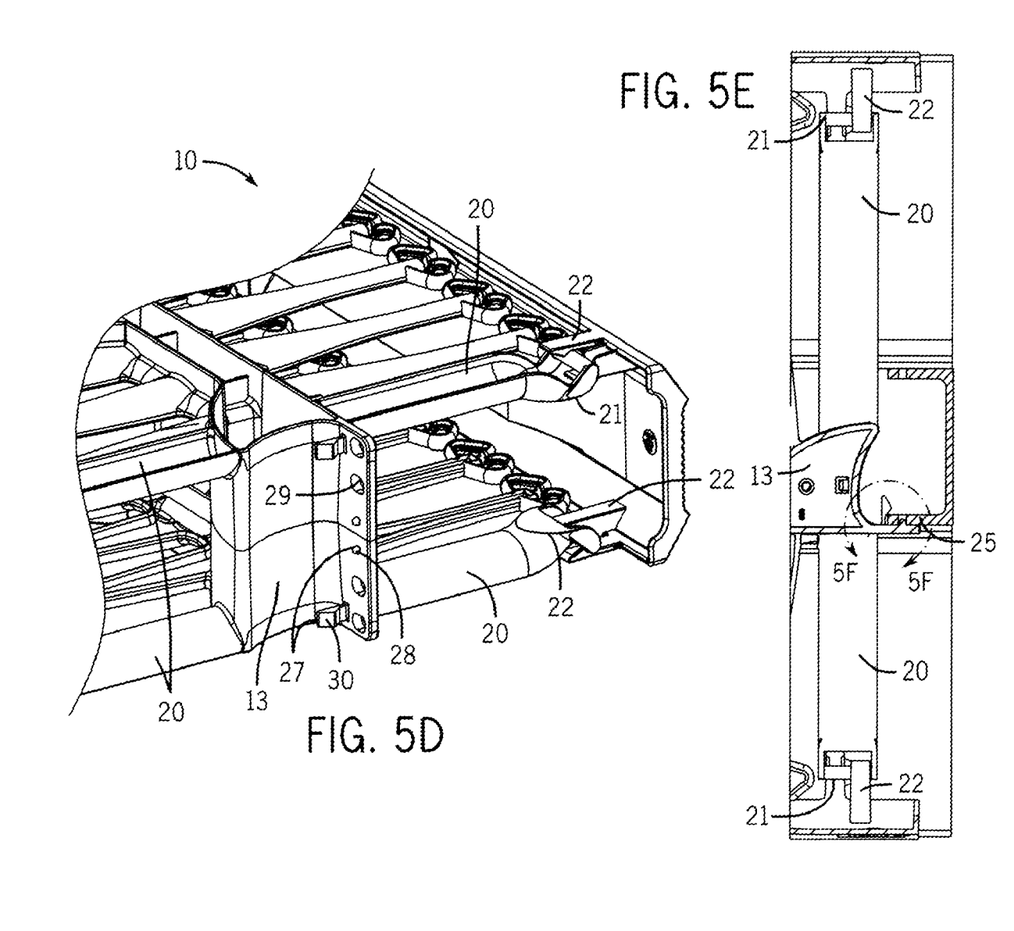
FIG. 5D is an exploded rear perspective view of the horizontal cable manager of FIG. 1A.
FIG. 5E is a partial top cross-section view of the horizontal cable manager of FIG. 5A taken along section Z-Z.
Figure 5F:
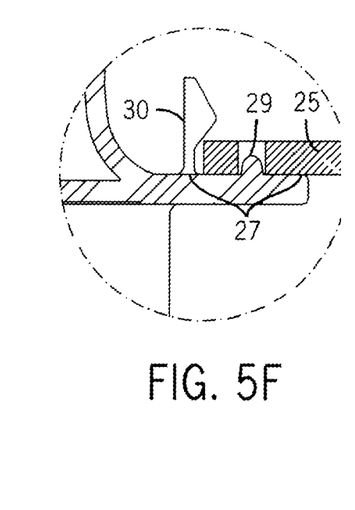
FIG. 5F is an exploded view of the snap-to-rack feature of FIG. 5E fastened to a vertical support of an electronic equipment rack.

FIGS. 5A-5F further illustrate the snap-to-rack feature 27 being used to temporarily hold the horizontal cable manager 10 in place while it is being more permanently fastened to the rack. FIGS. 5A-5C illustrate different views of the horizontal cable manager 10 attached to the electronic equipment rack 23. The vertical supports 25 of the electronic equipment rack 23 can include holes for many attachment heights for the one or more horizontal cable managers 10. The height of the horizontal cable manager 10 in FIGS. 5A-5F can span six holes of the vertical support 25. In other embodiments, the horizontal cable manager 10 can include only four attachment holes 29 to correspond with four holes on the vertical supports 25. The horizontal cable manager 10 can include projections such as first half-sphere extensions 28 that can be used for temporary attachment to two holes of the vertical supports 25. The horizontal cable manager 10 can also include second wing extensions 30. As shown in FIG. 5F, the first half-sphere extensions 28 can fit into holes on the vertical supports 25 to prevent the horizontal cable manager 10 from sliding down the vertical supports 25, while the second wing extensions 30 can snap around each vertical support 25 to temporarily hold the horizontal cable manager 10 against the vertical supports 25 during permanent installation.

Figure 6:
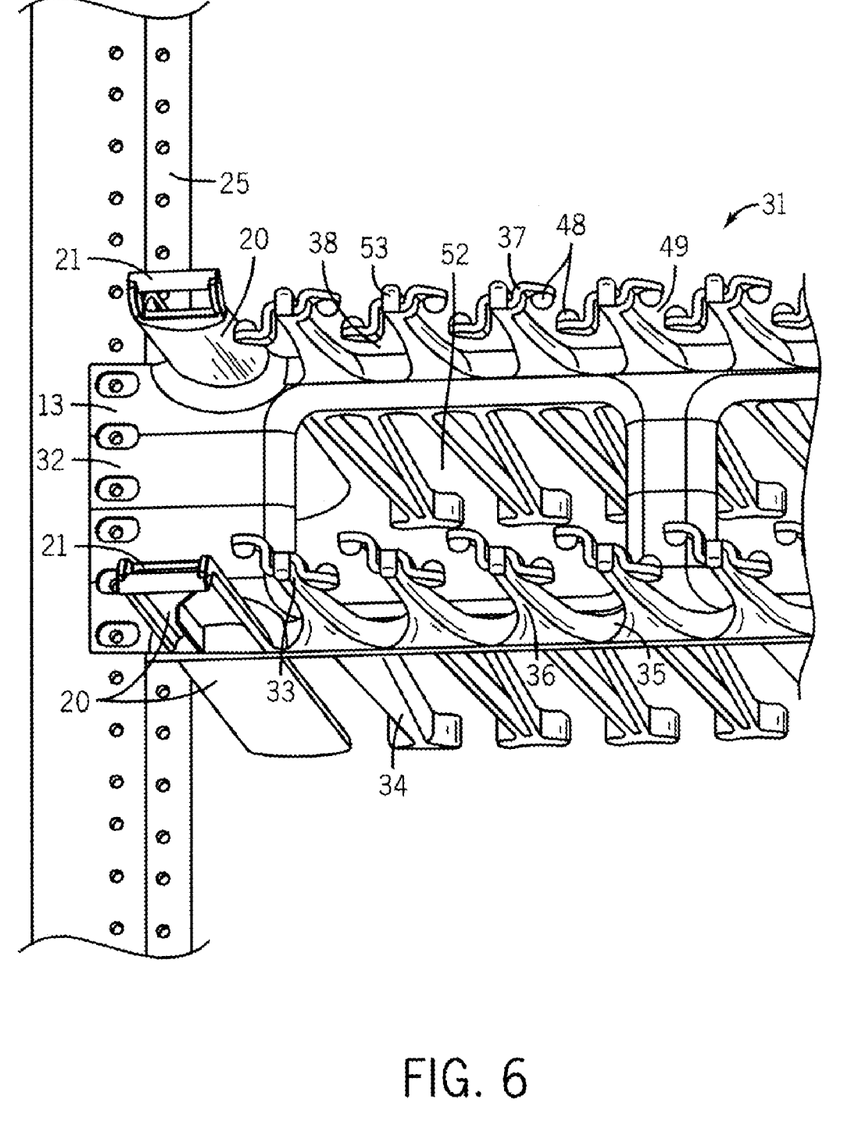
FIG. 6 is a partial front perspective view of the horizontal cable manager of FIG. 4.
Figure 7:
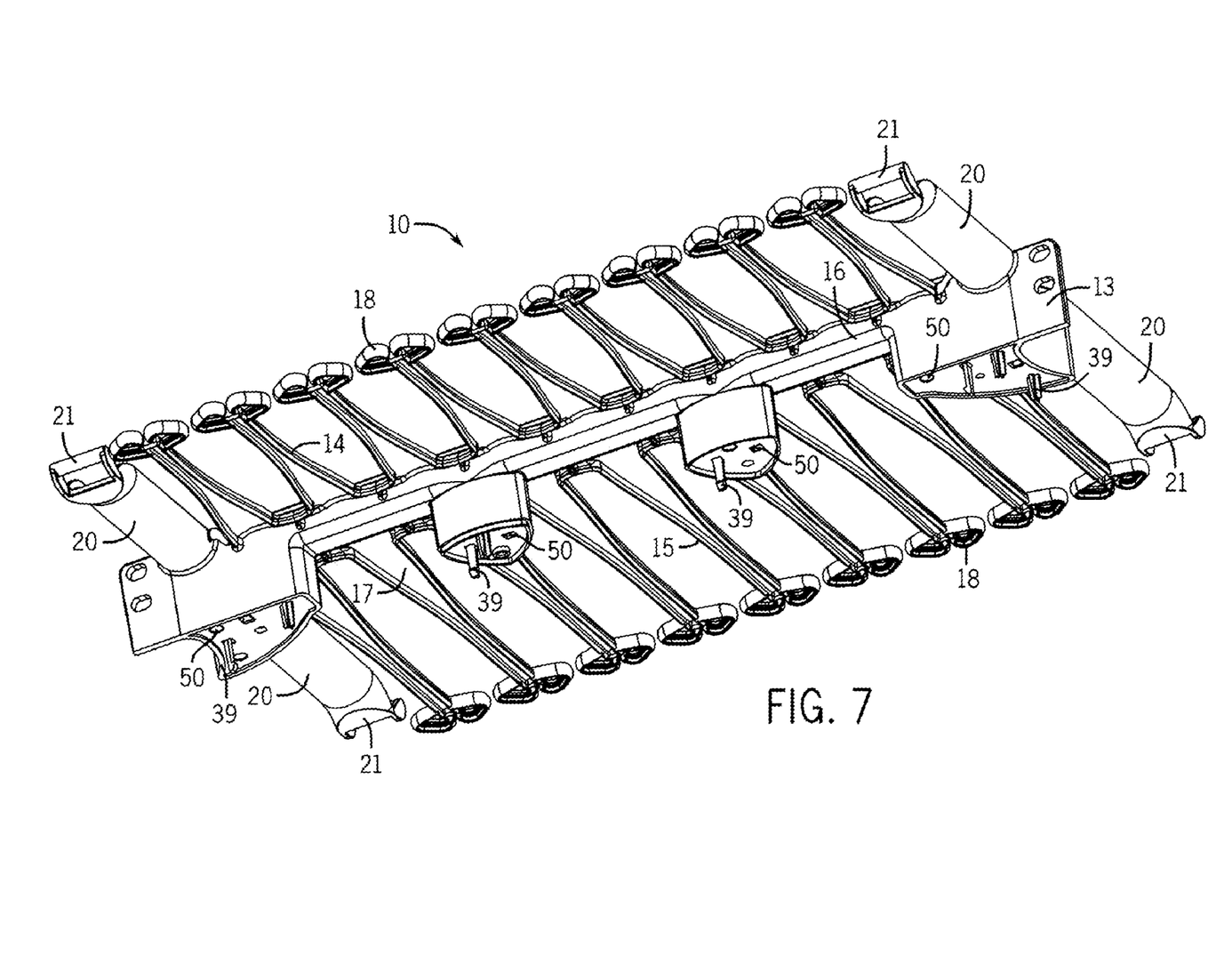
FIG. 7 is a bottom perspective view of a top half of the horizontal cable manager of FIG. 1A.
Figure 8:
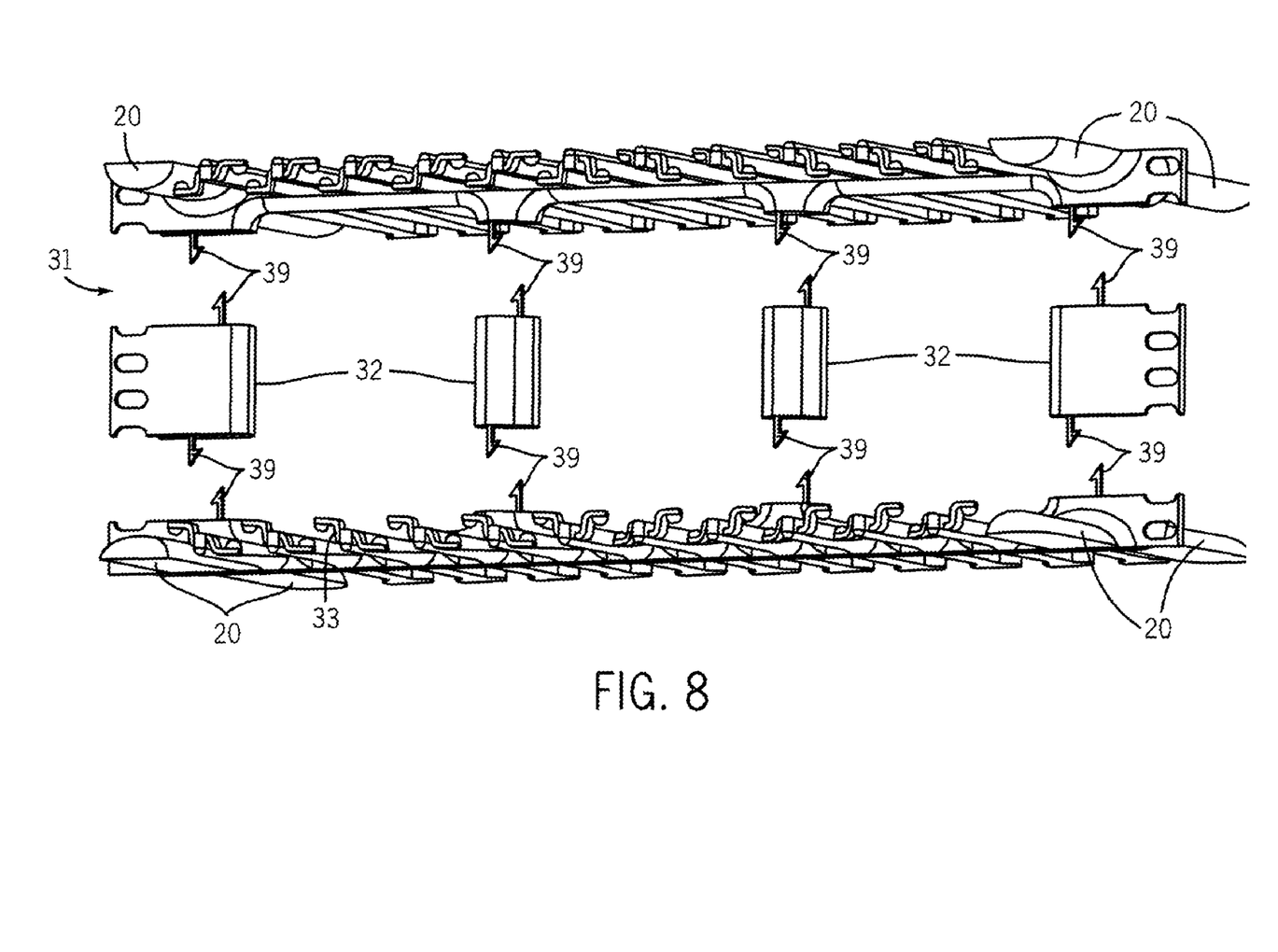
FIG. 8 is an exploded view of a horizontal cable manager including two identical parts that can snap together, according to another embodiment of the invention.
Figure 9:
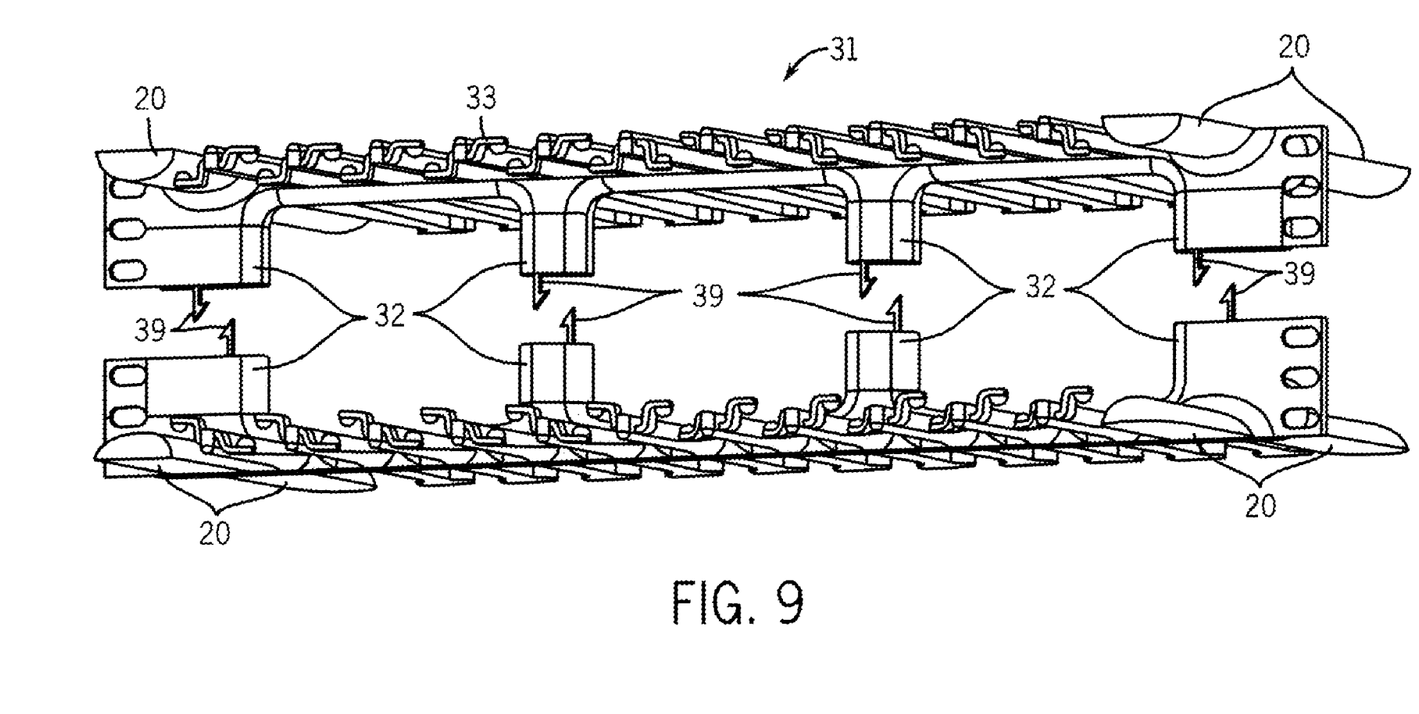
FIG. 9 is an exploded view of the horizontal cable manager of FIG. 6 including two identical parts that can snap together, according to another embodiment of the invention.
Figure 10:
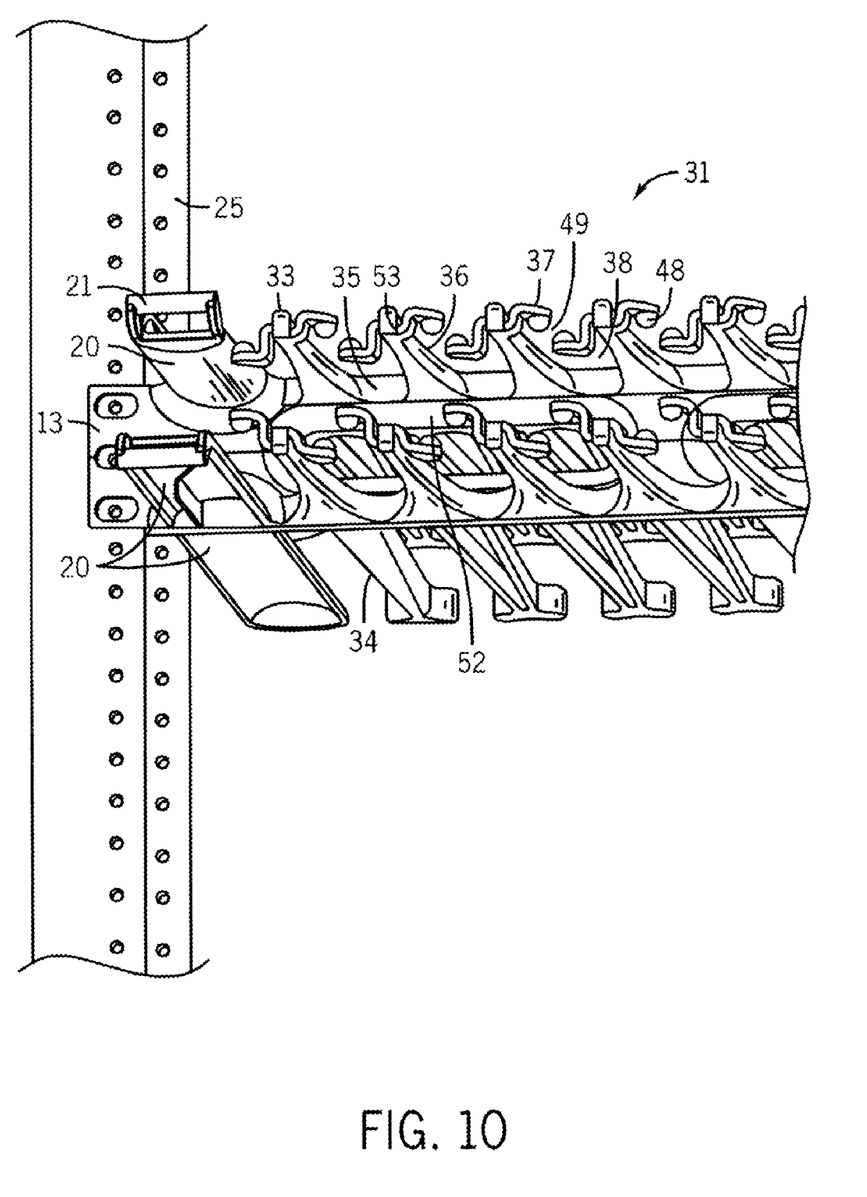
FIG. 10 is a partial front perspective view of the horizontal cable manager of FIG. 4.

FIG. 6 further illustrates the horizontal cable manager 31 of FIG. 4. The horizontal cable manager 31 can include two rack unit spacing connected to the vertical supports 25 of the electronic equipment rack 23. The two rack unit spacing can be achieved using spacers 32 in the base 13 of the horizontal cable manager 31. The manufacturer's tooling for each separate cable manager can include identical parts and spacers 32 that can snap together as shown in FIGS. 7-9. FIG. 7 illustrates one half of the horizontal cable manager 10 of FIGS. 1-5. FIGS. 8-10 illustrate the horizontal cable manager 31 of FIGS. 4 and 6. The horizontal cable manager 10, 31 in its final form can include two identical halves or sections that can be snapped together in a suitable manner, such as using fittings 39 that can be received by holes 50. Also, different heights can be achieved by positioning spacers 32 between the two identical halves. This can result in little additional machining costs for a wide range of different-sized cable managers. In addition, pass-through openings 52 can be created by adjacent spacers 32 that can allow cables to be easily run from the front to the rear of the horizontal cable manager 10, 31 or vice-versa.

In some embodiments, spacers are not used between the identical halves. FIG. 10 illustrates the horizontal cable manager 31 with one rack unit spacing connected to the electronic equipment rack 23. The purpose of the one rack unit spacing is to correspond to the standard spacing of electronic equipment along the electronic equipment rack 23. The two unit spacing illustrated in FIG. 6 can be 3.5 inches or two rack mounting units (also termed RUs, rack units, RMUs, or Us), while the one unit spacing illustrated in FIG. 10 can be 1.75 inches or 1 RU. The height of the spacers 32 can also be 1 RU, as shown in FIG. 8. The height of the spacers 32 can also be a fraction of 1 RU; for example, the spacers 32 can be 0.875 inches each, so that two spacers 32 stacked on the base 13 of the horizontal cable manager 31 can achieve 2 RU. Other fractions of an RU can also be used for spacer height.

The horizontal cable manager 31 shown in FIGS. 4, 6, and 8-10 includes front and rear fingers 33, 34 with different shaped ends. The fingers 33, 34 can include a base 35 and a shaft 36. However, as shown by the front fingers 33 in FIGS. 6 and 10, the fingers 33 or 34 can include S-shaped ends 37. The configuration of one side of the S-shaped end 37 can include an extension from the shaft 36 near its distal end 53 that curves upward (or downward) vertically, then extends outward horizontally away from the shaft, where it includes a downward (or upward) facing hemisphere 48. Adjacent fingers 33 or 34 can create a gap 49 in the horizontal plane rather than the vertical plane. Cables or wires can be received in a cable ring 38 created between two adjacent fingers 33 or 34 by drawing the cables or wires diagonally, rather than vertically, through the gap 49 between adjacent S-shaped ends 37. The cable manager 31 of FIGS. 4, 6, and 8-10 can only include front fingers 33 (for a single-sided cable manager) or both front and rear fingers 33, 34 (for a double-sided cable manager).

Figure 11:
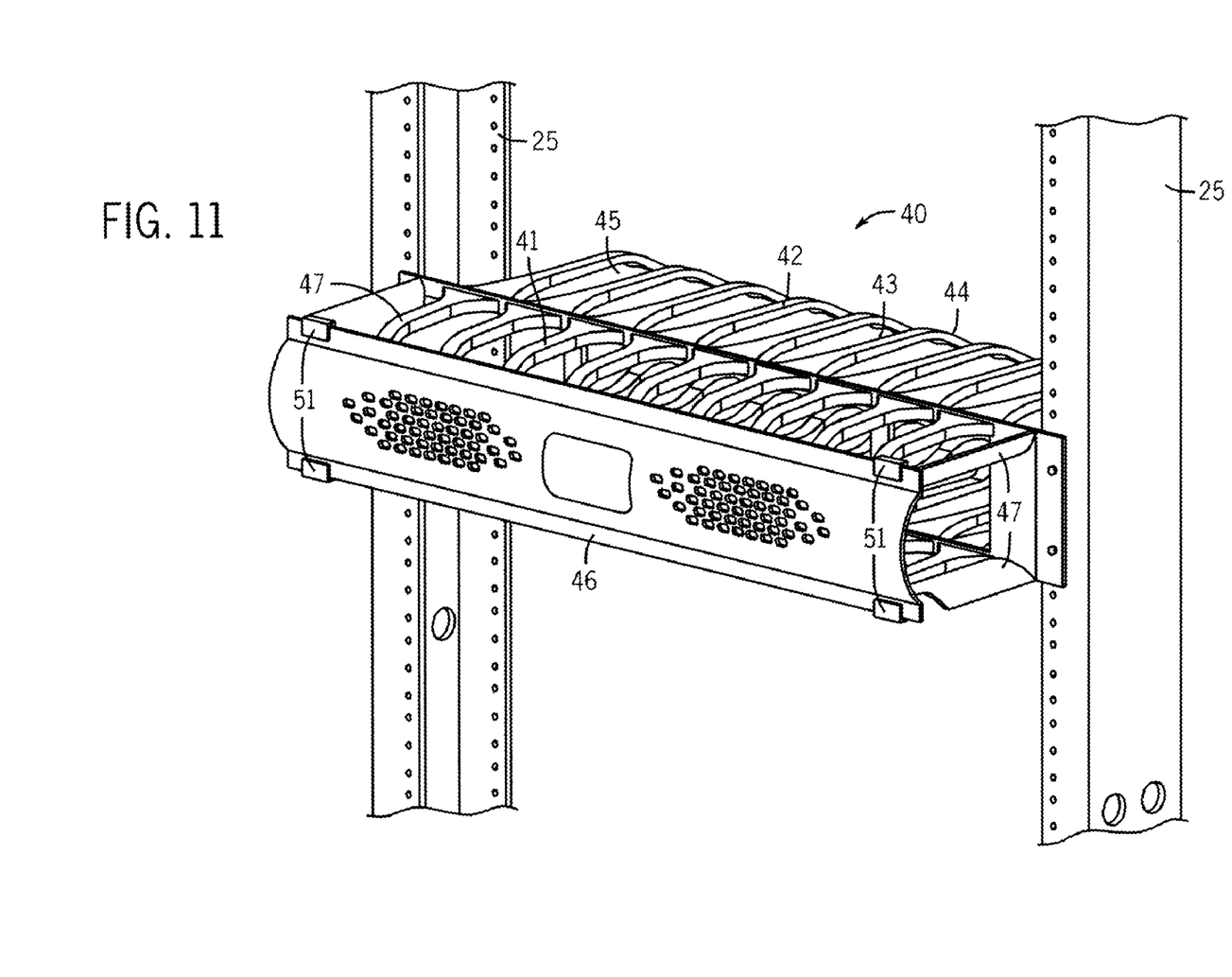
FIG. 11 is a front perspective view a horizontal cable manager according to another embodiment of the invention.
Figure 12:
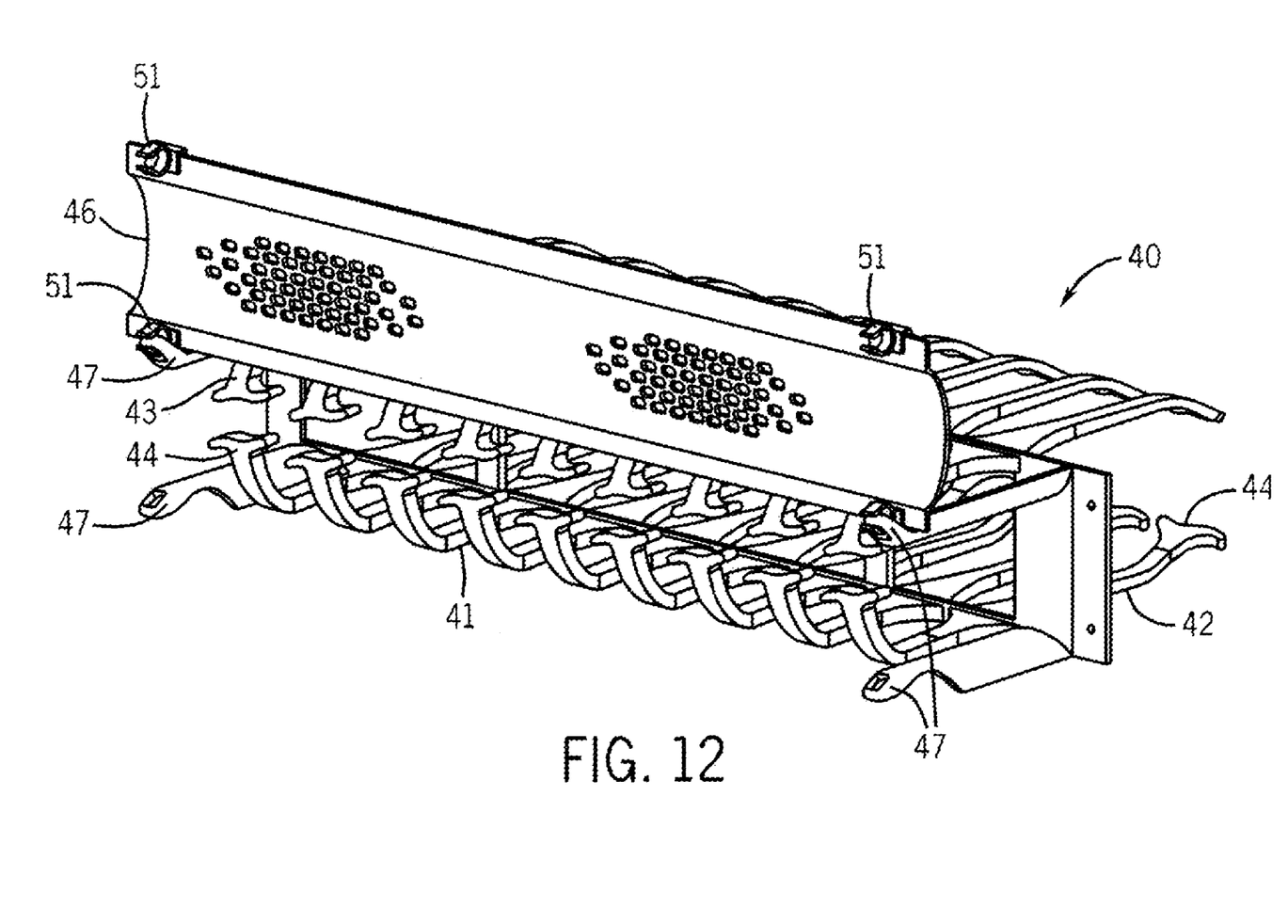
FIG. 12 is a side perspective view of the horizontal cable manager of FIG. 11 with the front cover rotated upward.

FIGS. 11-12 illustrate a horizontal cable manager 40 according to another embodiment of the invention. The horizontal cable manager 40, shown attached to the vertical supports 25 in FIG. 11, can include front and/or rear fingers 41, 42 that can be substantially curved downward or upward so that the bottom fingers 41 can curve inward toward the top fingers 41 and vice versa. The finger shafts 43 can be constructed of stiffer material while the finger ends 44 can be constructed of a flexible material and/or can be detachable from the finger shafts 43. The finger ends 44 can be detached during cable or wire placement, then reattached by snapping into the finger shafts 43 to create cable rings 45. This allows wires or cables to be inserted more easily into the cable ring 45, rather than having to slide through smaller openings when the ends are attached. A cover 46 can cover the fingers 41 as shown in FIG. 11 and can be rotated upward as shown in FIG. 12. The cover 46 can be attached to hinge supports 47 of the horizontal cable manager 40. Extensions 51 on the cover 46 can snap onto the hinge supports 47 for attachment. The cover 46 can be attached to only upper hinge supports 47 and rotated upward (as shown in FIG. 12). The cover 46 can also be attached to only lower hinge supports 47 and rotated downward.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein.

Various features and advantages of the invention are set forth in the following claims.

The invention claimed is:

1. A horizontal cable manager comprising:
    a horizontal base;
    a plurality of fingers extending from the horizontal base, each one of the plurality of fingers including a shaft and an arrow-shaped end,
        the arrow-shaped end including a first triangular member coupled to the shaft at a first distance away from a distal end of the shaft,
        the arrow-shaped end including a second triangular member coupled to an opposite side of the shaft at the first distance away from the distal end of the shaft; and
    at least two hinge supports, a first hinge support extending from a first end of the base past the plurality of fingers and a second hinge support extending from a second end of the base past the plurality of fingers; and
    a cover removably coupled to the at least two hinge supports.

2. The horizontal cable manager of claim 1 wherein at least one of the first triangular member and the second triangular member includes a first end coupled to the shaft and a second curved end extending beyond the distal end of the shaft.

3. The horizontal cable manager of claim 1 wherein the shaft includes a rounded, non-circular cross section.

4. The horizontal cable manager of claim 3 wherein the shaft includes a C-shaped cross section.

5. The horizontal cable manager of claim 1 wherein the plurality of fingers includes a first set of fingers extending forward from the base and a second set of fingers extending rearward from the base.

6. The horizontal cable manager of claim 5 wherein each one of the first set of fingers is longer than each one of the second set of fingers.

7. The horizontal cable manager of claim 1 and further comprising a third hinge support and fourth hinge support coupled to a bottom portion of the base; and wherein the first hinge support and the second hinge support are coupled to a top portion of the base.

8. The horizontal cable manager of claim 7 wherein the cover is rotatable upward when attached to the first hinge support and the second hinge support; and wherein the cover is rotatable downward when attached to the third hinge support and the fourth hinge support.

9. The horizontal cable manager of claim 1 wherein the base includes a top section and a bottom section; and further comprising at least one spacer positioned between the top section and the bottom section to increase a vertical height of the base.

10. The horizontal cable manager of claim 9, wherein a height of the at least one spacer is one of a fraction of a standard rack mounting unit and a multiple of a standard rack mounting unit.

11. A horizontal cable manager configured to be attached to an electronic equipment rack, the electronic equipment rack having a vertical support with rack holes, the horizontal cable manager comprising:
    a base including an attachment hole configured to be substantially permanently attached to the vertical supports with a fastener positioned through the attachment hole and one of the rack holes;
    the base including a first extension and a second wing extension positioned adjacent to the attachment hole;
    the first extension configured to be temporarily positioned in another one of the rack holes while the second wing extension wraps around the vertical support to temporarily snap the base to the vertical support until the base can be substantially permanently attached to the vertical support.

12. The horizontal cable manager of claim 11 wherein the first extension is in a shape of a half-sphere having a first radius corresponding to a second radius of the rack holes.

13. The horizontal cable manager of claim 11 wherein the second wing extension includes a triangular portion coupled to a projection, and wherein the projection is coupled to the base.

14. A horizontal cable manager comprising:
   a horizontal base including a first molded section and a second molded section, each one of the first molded section and the second molded section being identical and being adapted to be coupled together; and
   a plurality of fingers extending from each one of the first molded section and the second molded section,
      each one of the plurality of fingers including a shaft and an arrow-shaped end,
      the arrow-shaped end including a first triangular member coupled to the shaft at a first distance away from a distal end of the shaft,
      the arrow-shaped end including a second triangular member coupled to an opposite side of the shaft at the first distance away from the distal end of the shaft.

15. The horizontal cable manager of claim 14 and further comprising at least one spacer configured to be positioned between the first molded section and the second molded section to increase an overall height of the horizontal base.

16. The horizontal cable manager of claim 15, wherein an individual height of the at least one spacer is one of a fraction of a standard rack mounting unit and a multiple of a standard rack mounting unit.

17. The horizontal cable manager of claim 14 wherein at least one of the first triangular member and the second triangular member includes a first end coupled to the shaft and a second curved end extending beyond the distal end of the shaft.

18. The horizontal cable manager of claim 14 wherein the shaft includes a rounded, non-circular cross section.

19. The horizontal cable manager of claim 18 wherein the shaft includes a C-shaped cross section.

20. The horizontal cable manager of claim 14 wherein the plurality of fingers includes a first set of fingers extending forward from the base and a second set of fingers extending rearward from the horizontal base.

21. The horizontal cable manager of claim 20 wherein each one of the first set of fingers is longer than each one of the second set of fingers.

22. The horizontal cable manager of claim 14 and further comprising at least two hinge supports, a first hinge support extending from a first end of the horizontal base past the plurality of fingers and a second hinge support extending from a second end of the horizontal base past the plurality of fingers; and a cover removably coupled to the at least two hinge supports.

23. The horizontal cable manager of claim 22 and further comprising a third hinge support and fourth hinge support coupled to a bottom portion of the horizontal base; and wherein the first hinge support and the second hinge support are coupled to a top portion of the horizontal base.

24. The horizontal cable manager of claim 23 wherein the cover is rotatable upward when attached to the first hinge support and the second hinge support; and wherein the cover is rotatable downward when attached to the third hinge support and the fourth hinge support.

* * * * *